United States Patent
Metawea (10) Patent No.: US 11,108,537 B1
(45) Date of Patent: Aug. 31, 2021

(54) RADIOFREQUENCY CARRIER TRACKING FOR AMPLITUDE-MODULATED SIGNALS WITH AN UNSTABLE REFERENCE CLOCK

(71) Applicant: SHENZHEN GOODIX TECHNOLOGY CO., LTD., Shenzhen (CN)

(72) Inventor: Ahmed Sayed Abbas Metawea, Cairo (EG)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/110,303

(22) Filed: Dec. 3, 2020

(51) Int. Cl.
- *H03D 3/00* (2006.01)
- *H04L 7/033* (2006.01)
- *H04L 7/00* (2006.01)

(52) U.S. Cl.
CPC .......... *H04L 7/0331* (2013.01); *H04L 7/0033* (2013.01)

(58) Field of Classification Search
CPC .......................... H04L 7/0331; H04L 7/0033
USPC .................. 375/376, 371, 373, 375
See application file for complete search history.

(56) References Cited

U.S. PATENT DOCUMENTS

| | | | |
|---|---|---|---|
| 8,625,729 B2 * | 1/2014 | Villarino-Villa | G01R 31/31711 375/376 |
| 2004/0088597 A1 * | 5/2004 | Wu | G06F 11/1604 713/500 |

* cited by examiner

*Primary Examiner* — Tesfaldet Bocure
(74) *Attorney, Agent, or Firm* — Kilpatrick Townsend & Stockton LLP (57) ABSTRACT

Techniques are described for accurate tracking of a radiofrequency (RF) carrier for amplitude-modulated signals in unstable reference clock environments. For example, some embodiments operate in context of clock circuits in devices configured for near-field communication (NFC) card emulation (CE) mode. The clock circuits seek to generate an internal clocking signal by tracking a clock reference, such as an RF carrier. In some cases, the clock reference can unpredictably become unreliable for periods of time, during which continued tracking of the unreliable clock reference can yield appreciable frequency and phase errors in the generated internal clocking signal. Embodiments implement phase delta detection with time limiting to limit the magnitude of such errors in the internal clocking signal introduced while tracking an unreliable clock reference. For example, embodiments force gating of phase tracking signals to limit their duration, thereby limiting impacts of those phase tracking signals on the clock circuit output.

20 Claims, 7 Drawing Sheets

(Prior Art)

RADIOFREQUENCY CARRIER TRACKING FOR AMPLITUDE-MODULATED SIGNALS WITH AN UNSTABLE REFERENCE CLOCK

FIELD OF THE INVENTION

The present invention relates generally to clock recovery circuits. More particularly, embodiments relate to rapid and accurate tracking of a radiofrequency (RF) carrier for amplitude-modulated signals in unstable reference clock environments, such as for phase-lock loop (PLL) circuits integrated in mobile electronic devices for use with near-field communication (NFC) card emulation (CE) mode communications.

BACKGROUND OF THE INVENTION

Various types of short-range radiofrequency (RF) communications are becoming ubiquitous for a wide range of applications, such as for contactless access cards, contactless payment cards, contactless interfaces between devices and peripherals, etc. Near-Field Communications (NFC) is one such RF communications technology that uses inductive coupling between devices to effect contactless exchange of data between devices over a short range (e.g., around 1.5 inches). Many NFC applications support passive NFC devices, such as a passive card or a passive tag. In such applications, the passive device includes one or more integrated chips and an integrated antenna, but no battery. When the passive device is being read by an active reader device, the reader sends a command transmission over an RF carrier (typically by amplitude shift key (ASK) modulation of the carrier signal). The RF carrier induces a current in the antenna of the passive device, which can be harvested by the passive device to power and clock its integrated chip(s). The activated chip(s) can then automatically respond by sending back a signal over the RF carrier, with the response signal being actively modulated according to data stored on the passive device. The reader can detect and process the response signal to recover the transmitted data.

In such a passive NFC transaction, operation of the passive device may rely on generating and maintaining a reliable clock that accurately tracks the RF carrier. However, in some modes of operation, RF carrier tends not to provide a reliable clock reference for the passive device. For example, in a so-called card emulation (CE) mode, a smart phone, or portable electronic device is configured to emulate a passive NFC device. The portable electronic device may have a relatively small antenna, such that only a small signal level is received from the reader; and the portable electronic device may rely on phase-lock loops (PLLs) or other clock circuits to generate a stable and accurate internal clock signal from the received small-signal RF carrier. In such cases, the ASK modulation of the RF carrier by the reader, and/or active load modulation (ALM) by the passive device can tend to limit the ability of the passive device to generate and maintain an accurate internal clock signal from the RF carrier.

BRIEF SUMMARY OF THE INVENTION

Embodiments provide circuits, devices, and methods for accurate tracking of a radiofrequency (RF) carrier for amplitude-modulated RF signals in unstable reference clock environments. For example, some embodiments can operate in context of phase-lock loop (PLL) circuits integrated in mobile electronic devices for use with a near-field communication (NFC) card emulation (CE) mode of operation. During operation, the RF carrier can become an unreliable clock reference for an emulated-passive device (i.e., an electronic device operating in NFC CE mode) due, for example, to amplitude modulation of the RF carrier by the reader, and/or to active load modulation of the RF carrier by the emulated-passive device. It can be desirable to stop the PLL from tracking the RF carrier during times when the RF carrier is unreliable (i.e., as a clock reference). However, it can take time to detect that the RF carrier has become unreliable, leaving a time window during which the PLL continues to track an unreliable reference. Embodiments described herein seek to limit the amount of phase and/or frequency error introduced in the PLL output while tracking an unreliable reference. For example, during tracking, a PLL typically asserts phase tracking signals to maintain phase alignment between its output and its input reference. Embodiments can provide adjustable time-limited gating of those phase tracking signals, thereby limiting the amount of change in phase introduced by the PLL.

According to one set of embodiments, a time limiter circuit is provided for integration with a phase detector of a phase-locked loop (PLL). The time limiter circuit includes: an absolute phase detection sub-circuit to detect whether a phase tracking signal is asserted by the phase detector, the phase tracking signal indicating a detected phase difference between an output signal of the PLL and an input reference signal of the PLL; a delay timer sub-circuit, coupled with the absolute phase detection sub-circuit to determine, automatically responsive to the absolute phase detection sub-circuit detecting that the phase tracking signal is asserted, whether a signal duration of the phase tracking signal exceeds a threshold duration; and a pulse gating sub-circuit, coupled with the delay timer sub-circuit to force de-assertion of the phase tracking signal for at least a remainder of a present operating cycle of the PLL automatically responsive to the delay timer sub-circuit determining that the signal duration exceeds the threshold duration.

According to another set of embodiments, a phase-locked loop (PLL) circuit is provided. The PLL circuit includes: a PLL input node to receive a reference clock signal; a PLL output node to output a generated clock signal; and a phase detector, coupled with the PLL input node and the PLL output node to generate a phase tracking signal indicating a phase difference between the reference clock signal and the generated clock signal. The phase tracking signal includes a first phase tracking signal responsive to a phase of the reference clock signal preceding a phase of the generated clock signal, and a second phase tracking signal responsive to the phase of the generated clock signal preceding the phase of the reference clock signal. The phase detector has a time limiter circuit, including: an absolute phase detection sub-circuit to detect whether the phase tracking signal is asserted by the phase detector; a delay timer sub-circuit, coupled with the absolute phase detection sub-circuit to determine, automatically responsive to the absolute phase detection sub-circuit detecting that the phase tracking signal is asserted, whether a signal duration of the phase tracking signal exceeds a threshold duration; and a pulse gating sub-circuit, coupled with the delay timer sub-circuit to force de-assertion of the phase tracking signal for a remainder of at least a present operating cycle of the PLL automatically responsive to the delay timer sub-circuit determining that the signal duration exceeds the threshold duration. In some such embodiments, a portable electronic device is provided, having the PLL circuit integrated therein, wherein: the portable electronic device is associated with stored data and comprises an active load modulation circuit configured to generate a response signal based on active load modulation of the generated clock signal in accordance with a near field communication (NFC) card emulation (CE) mode of operation According to another set of embodiments, a method is provided. The method includes: detecting whether a phase tracking signal is asserted by a phase detector of the PLL, the phase tracking signal indicating a detected phase difference between an output signal of the PLL and an input reference signal of the PLL; determining, automatically responsive to detecting that the phase tracking signal is asserted, whether a signal duration of the phase tracking signal exceeds a threshold duration; and forcing de-assertion of the phase tracking signal for a remainder of a present operating cycle of the PLL automatically responsive to determining that the signal duration exceeds the threshold duration.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Various types of short-range radiofrequency (RF) communications are becoming ubiquitous for a wide range of applications. For example, passive, contactless data devices are being used to authorize access to secure facilities, to effect electronic payment transactions at points of sale, to withdraw cash at automated teller machines, to quickly register and/or connect peripherals (e.g., headphones, printers, drives, etc.) to electronic devices, etc. Near-Field Communications (NFC) is one such RF communications technology that uses inductive coupling between devices to effect contactless exchange of data between devices over a short range (e.g., around 1.5 inches). Many NFC applications support passive NFC devices, such as a passive card or a passive tag. In such applications, the passive device includes one or more integrated chips and an integrated antenna, but no battery. When the passive device is being read by an active reader device, the reader sends a command transmission over an RF carrier (typically by amplitude shift key (ASK) modulation of the carrier signal). The RF carrier induces a current in the antenna of the passive device, which can be harvested by the passive device to power and clock its integrated chip(s). The activated chip(s) can then automatically respond by sending back a signal over the RF carrier, with the response signal being actively modulated according to data stored on the passive device. The reader can detect and process the response signal to recover the transmitted data. In such a passive NFC transaction, operation of the passive device may rely on generating and maintaining a reliable clock that accurately tracks the RF carrier. However, in some modes of operation, RF carrier tends not to provide a reliable clock reference for the passive device.

Figure 1:
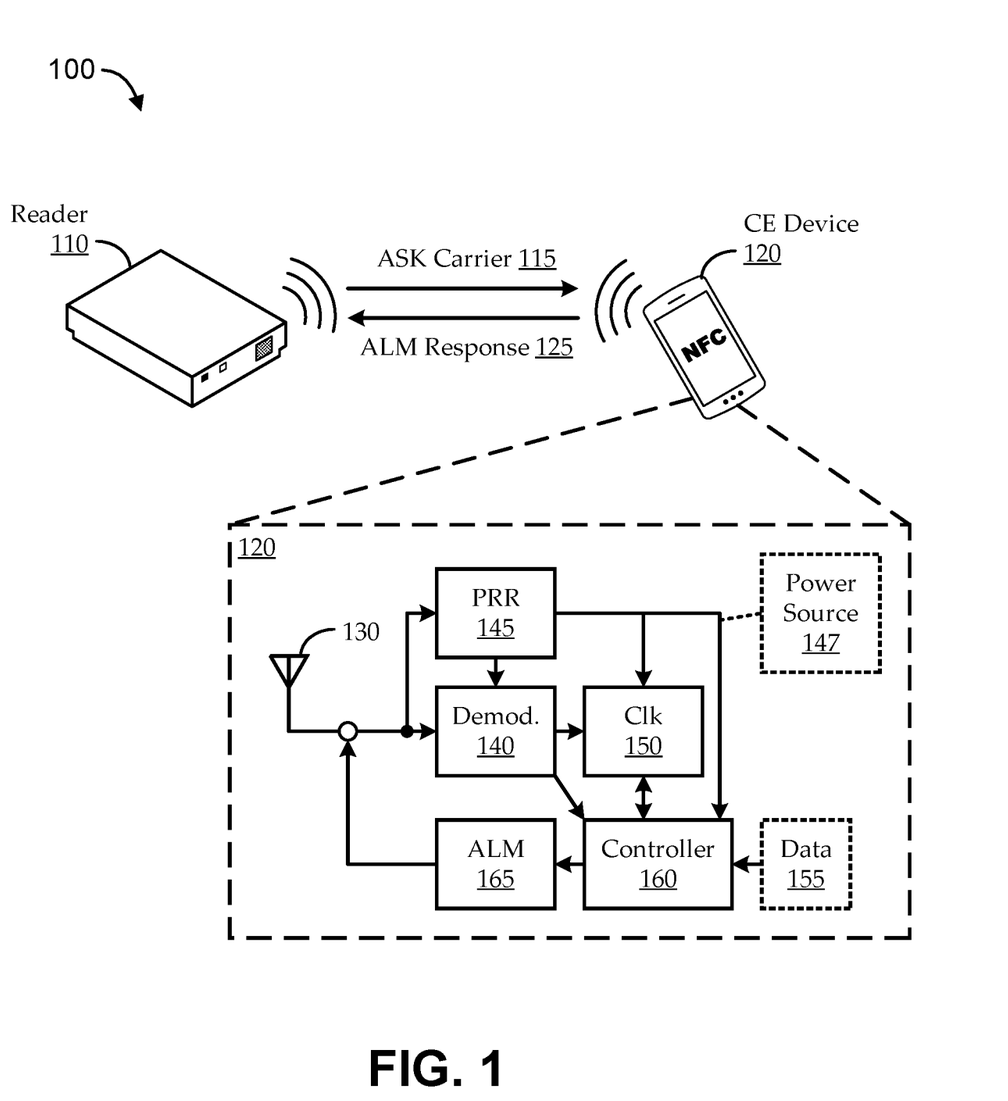
FIG. 1 shows an illustrative Near-Field Communications (NFC) transaction environment with a device operating in a so-called card emulation (CE) mode, as context for various embodiments described herein.

For the sake of illustration, FIG. 1 shows an illustrative Near-Field Communications (NFC) transaction environment with a device operating in a so-called card emulation (CE) mode, as context for various embodiments described herein. The CE device 120 can be a smart phone, wearable device (e.g., smart watch or fitness tracker), or any other suitable portable electronic device. In this context, the CE device 120 is typically an active device, but the CE device 120 is configured to operate in a mode in which it emulates a passive NFC device, such as a passive contactless card or tag. For example, a smart phone can be configured to support the NFC CE mode of operation, so that it can be used to effect mobile payment transactions, and the like, even while powered off, or in standby power mode.

As described above, a typical NFC transaction can involve the CE device 120 being read by a reader 110, such as an electronic lock, point of sale terminal, etc. The reader 110 can broadcast a signal over an ASK-modulated RF carrier 115, typically at 13.56 Megahertz. The RF carrier 115 induces a current in an antenna 130 of the CE device 120, and the antenna 130 can be configured specifically for NFC communications. As illustrated, antenna 130 of the CE device 120 can be coupled with one or more integrated circuits and/or data storage. In some implementations, some or all of the integrated circuits are dedicated circuits for implementing the NFC CE mode of operation, such as by including an integrated NFC (or NFC CE mode) chipset into a smart phone. In other implementations, some or all of the integrated circuits are implemented by multi-functional components of the CE device 120, such as by the main processors and/or other circuits of a smart phone. The integrated circuits can implement some or all of a demodulator module 140, a power regulator and/or recovery (PRR) module 145, a clock module 150, a controller module 160, and an active load modulation (ALM) module 165. The controller module 160 and/or other modules of the CE device 120 can include, or be implemented with, a central processing unit CPU, an application-specific integrated circuit (ASIC), an application-specific instruction-set processor (ASIP), a digital signal processor (DSP), a field-programmable gate array (FPGA), a programmable logic device (PLD), a controller, a microcontroller unit, a reduced instruction set (RISC) processor, a complex instruction set processor (CISC), a microprocessor, or the like, or any combination thereof. In some cases, data communicated by the CE device 120 in NFC CE mode is stored in on-board data storage 155 of the CE device 120, such as in a so-called secure element. In other cases, some or all of the data is stored off-board the CE device 120, such as in so-called Host Card Emulation (HCE) implementations, or the like.

In a typical operational example, the RF carrier 115 induces a current signal in the antenna 130 of the CE device 120. The energy from the current signal can be harvested and regulated by the PRR module 145 to power other component modules. In a typical NFC reader/writer mode with a passive device, there may be no power source at all, such that all the power for operation must be harvested from the received RF carrier 115. In NFC CE mode, the CE device 120 typically includes a power source 147, such as an integrated battery. However, it is desirable that, when operating in NFC CE mode, the CE device 120 draws minimal power from the integrated power source 147.

The current signal induced from the RF carrier 115 can also be demodulated by the demodulator module 140 and used by the clock module 150 to generate an internal clocking signal (or multiple clocking signals). As described herein, it is desirable for the internal clocking signal to track the RF carrier 115, so that the internal clocking signal can be used to generate a response transmission from the CE device 120 back to the reader 110. The internal clocking signal can also be used to clock other components, such as the controller module 160 and the ALM module 165. For example, the controller module 160 controls operation of one or more components of the system in NFC CE mode, while being powered at least partially by harvested power output by the PRR module, and while being clocked by the internal clocking signal output by the clock module 150. In such a manner, the controller module 160 can direct the ALM module 165 to actively modulate the internal clocking signal by switching a load (e.g., by switching a power amplifier on and off) in accordance with particular data associated with the CE device 120. For example, the active load modulation of the internal clocking signal can be used to communicate identification codes, biometric data, image data, etc.

The output of the ALM module 165 is an ALM response signal 125 generate by the active load modulation of the internal clocking signal output. The generated ALM response signal 125 is used to drive the antenna 130, such that the antenna 130 broadcasts the ALM response signal 125 (e.g., at the same carrier frequency of 13.56 Megahertz) back to the reader 110. Thus, in a typical NFC CE mode transaction, the CE device 120 detects broadcast of the ASK-modulated RF carrier 115 signal from the reader 110 and automatically responds with a broadcast of the ALM response signal 125. The reader can detect and process the response ALM response signal 125 to recover the transmitted data, from which the reader 110 can make suitable determinations, such as whether to authorize access, to authorize a payment transaction, to effect a further data exchange, etc.

It is notable that the reader 110 and the CE device 120 rely on specific carrier frequencies for their communications, such that effective transacting may rely on the CE device 120 being able to generate and maintain a reliable internal clock signal that accurately tracks the received RF carrier 115. However, particularly in NFC CE mode, the RF carrier 115 tends not to provide a reliable clock reference for the CE device 120. For example, in NFC reader/writer mode, dedicated passive smart cards and/or smart tags are often implemented with relatively large antennas capable of receiving a relatively large signal level, and dedicated passive smart cards and/or smart tags typically use so-called passive load modulation (PLM) instead of ALM. For at least those reasons, such dedicated passive devices are typically able to generate a sufficiently reliable internal clock signal from the received RF carrier 115. However, CE devices 120 often include appreciably smaller antennas (e.g., antenna 130), which tend to receive an appreciably smaller signal level. As such, it can be desirable for the clock module 150 of a CE device 120 to include more complex clock circuits to assist with generating a stable and accurate internal clock signal from the received small-signal RF carrier 115, while drawing only minimal power from the power source 147. Embodiments of the clock module 150 include a phase-locked loop (PLL). PLLs operated by dynamically controlling loop parameters in an attempt to maintain tracking between their generated output and a received reference.

Figure 2A:
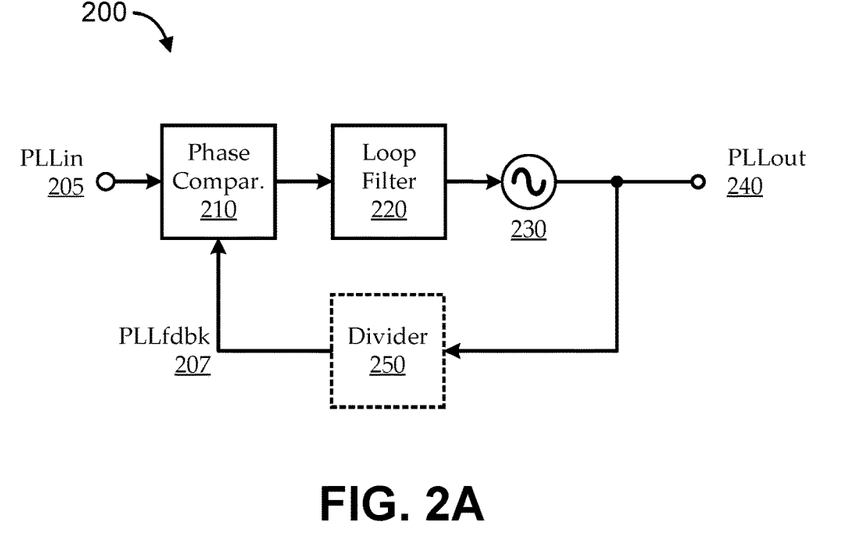
FIG. 2A shows an illustrative phase-locked-loop (PLL) circuit, as context for various embodiments.

For added context, FIG. 2A shows an illustrative phase-locked-loop (PLL) circuit 200. The PLL circuit 200 generates a PLL output signal (PLL_out) 240 in accordance with a received PLL input signal (PLL_in) 205. For example, PLL_in 205 can be a clock reference signal received from the RF carrier 115 at the NFC carrier frequency. The PLL circuit 200 uses a feedback loop to generate PLL_out 240 in an attempt to keep PLL_out 240 locked to a desired output frequency (e.g., the frequency of PLL_in 205, or a whole or fractional multiple of the input frequency of PLL_in 205). As illustrated, the PLL circuit 200 includes a phase comparison block 210, a loop filter block 220, a voltage controlled oscillator block 230. Some implementations also include a divider block 250.

The phase comparison block 210 can be implemented as a phase/frequency detector (PFD), or any other suitable component, that receives PLL_in 205 at an input reference frequency ($f_{REF}$) and compares PLL_in 205 with a signal fed back by the feedback loop of the PLL circuit 200. The fed back signal (PLL_fdbk 207) is at a feedback frequency ($f_{FDBK}$). The output of the phase comparison block 210 is a function of the comparison and is fed to the loop filter block 220. The loop filter block 220 can include any suitable components for facilitating filtering over the feedback loop, such as a charge pump and a low-pass filter. In some implementations, the charge pump is implemented as part of the phase comparison block 210 and used to drive the loop filter 220.

The output of the loop filter block 220 can be used as a control voltage for controlling the VCO block 230. The VCO block 230 can include any suitable oscillator, such as an inductive-capacitive (LC) oscillator, a ring oscillator, etc. The output frequency of the PLL circuit 200 (i.e., the frequency of PLL_out 240), or $f_{OUT}$, can therefore by controlled at least partially by the VCO block 230. In some implementations, PLL_out 240 is fed directly back to the phase comparison block 210 to complete the feedback loop of the PLL circuit 200. In other implementations, $f_{OUT}$ is further a function of a dividing value associated with a divider block 250. For example, if the divider block 250 is designed to divide $f_{OUT}$ by N (e.g., where N is a non-zero integer), the PLL circuit 200 will seek to lock $f_{OUT}$ to a frequency that is N times $f_{REF}$ (the frequency of PLL_in 205). In that way, the dividing value associated with the divider block 250 can effectively define the mathematical relationship between the frequencies of PLL_out 240 and PLL_in 205, thereby effectively controlling $f_{OUT}$. Embodiments described herein generally assume that the PLL circuit 200 is configured to generate the PLL_out 240 to track the frequency and phase of the PLL_in 205 (i.e., that the generated internal clocking signal tracks the RF carrier 115). As such, the PLL circuit 200 of the clock module 150 of FIG. 1 may be implemented without a divider block 250, or with N=1.

Figure 2B:
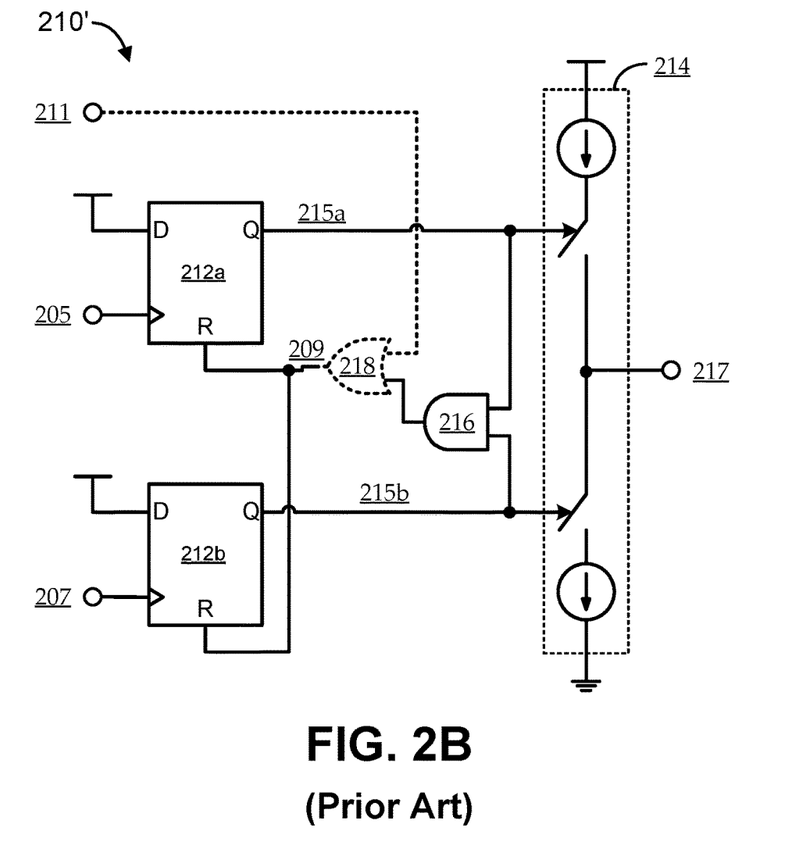
FIG. 2B shows an illustrative implementation of a conventional phase comparison block.

For further context, FIG. 2B shows an illustrative implementation of a conventional phase comparison block 210 (labeled as 210'). A first flip-flop 212a is configured as an edge detector for detecting a rising edge of PLL_in 205 (the clock reference signal), and a second flip-flop 212b is configured as an edge detector for detecting a rising edge of PLL_fdbk 207 (the loop feedback signal corresponding to the generated internal clocking signal). When the first flip-flop 212a is triggered, it outputs (and holds) a first phase tracking signal 215a (e.g., an "up" signal). When the second flip-flop 212b is triggered, it outputs (and holds) a second phase tracking signal 215b (e.g., a "down" signal). The first and second phase tracking signals 215 are coupled with a charge pump 214 that generated a loop filter current output 217. In particular, the first phase tracking signal 215a couples a first current source to the loop filter current output 217 that increases the amount of current being pumped to the loop filter, and the second phase tracking signal 215b couples a second current source to the loop filter current output 217 that decreases the amount of current being pumped to the loop filter. The phase tracking signals 215 are both coupled with an AND gate 216, which outputs a reset signal 209. As such, when both phase tracking signals 215 are asserted (i.e., rising edges are detected by both flip flops 212), the reset signal 209 is asserted, causing the flip-flops 212 to reset until the next PLL loop cycle.

As used herein, terms like "asserting" a signal, the signal is "asserted," are intended generally to indicate setting a signal to a logical value that indicates presence of a particular associated condition. In some embodiments, a signal is asserted by having a logical value of HIGH, TRUE, or '1', or the like; such as by holding the signal at a particular voltage level associated with that logical value. For example, each illustrated flip-flop 212 is illustrated as configured to assert a respective phase tracking signal 215 by switching the phase tracking signal 215 to a HIGH voltage level at its "Q" output responsive to detecting a rising edge of a triggering signal received at its input (i.e., either PLL_in 205 or PLL_fdbk 207). However, those of skill in the art will recognize that, with trivial variations to implementations illustrated and described herein, particular signals will be considered "asserted" when they are set to a logical LOW, FALSE, '0', or the like. For example, coupling each respective phase tracking signal 215 to a Q-bar output (complement of Q) of its associated flip flop 212, and adding a NOT gate in the path to the charge pump 214, results in an essentially equivalent circuit where the phase tracking signals 215 are "asserted" by setting their value to '0'.

In effect, if the phase of PLL_in 205 is left-shifted relative to (i.e., faster than that of) PLL_fdbk 207, the first flip-flop 212a will trigger first, thereby asserting the first phase tracking signal 215a (the "up" signal). While the first phase tracking signal 215a is asserted, more current is pumped into the loop filter 220 via charge pump 214 to compensate for the phase difference. When the PLL_fdbk 207 edge is detected by the second flip-flop 212b, the second phase tracking signal 215b is momentarily asserted, causing the AND gate 216 to assert the reset signal 209, and resetting the flip-flops 212 (and de-asserting the phase tracking signals 215). As a corollary, if the phase of PLL_fdbk 207 is left-shifted relative to (i.e., faster than that of) PLL_in 205, the second flip-flop 212b will trigger first, thereby asserting the second phase tracking signal 215b (the "down" signal). While the second phase tracking signal 215b is asserted, current is reduced to the loop filter 220 via charge pump 214 to compensate for the phase difference. When the PLL_in 205 edge is detected by the first flip-flop 212a, the first phase tracking signal 215a is momentarily asserted, causing the AND gate 216 to assert the reset signal 209, and resetting the flip-flops 212 (and de-asserting the phase tracking signals 215).

As described above, PLL operation typically involves dynamic adjustment of loop parameters to maintain tracking of the output signal to the input reference. The described conventional phase tracking (e.g., according to FIG. 2B) tends to work well, as long as there is a stable clock reference at the input of the PLL by which to track. In the case of NFC CE mode, however, the input reference is typically the signal on the antenna 130, which can be unreliable. For example, when the CE device 120 is receiving, the signal on the antenna (the RF carrier 115) is being ASK-modulated, such that the clock reference for the PLL toggles unpredictably between being present and being absent (i.e., assuming typical 100-percent ASK modulation used by NFC readers). Similarly, when the CE device 120 is transmitting, the signal on the antenna (the ALM response signal 125) is being actively load-modulated, such that the amplitude of the signal changes in accordance with the data signal. If the PLL is used to track an unreliable clock reference, the output of the PLL will similarly be an unreliable output signal. For example, there could be large swings in phase and frequency error (relative to the desired carrier phase and frequency) during the times when the clock reference becomes unreliable, and as the PLL attempts to regain tracking when the reliable clock reference returns.

As such, some phase comparison blocks 210 are configured to selectively switch the PLL between open-loop and closed-loop modes based on the reliability of the clock reference. While the clock reference is reliable, it is desirable for the PLL to operate in the closed-loop mode, whereby the PLL output is tracked to the clock reference at its input by dynamically updating loop parameters. While the clock reference is unreliable, it is desirable for the PLL to operate in the open-loop mode, whereby the PLL output is not tracked to the clock reference at its input; instead maintaining its loop parameters in a last-updated condition. As illustrated, implementations can include a pause signal 211 that is asserted responsive to detecting the carrier being in an unreliable condition. In such implementations, the output of the AND gate 216 and the pause signal 211 can be inputs to an OR gate 218, which outputs the reset signal 209. For example, when the clock reference is unreliable, the pause signal 211 is asserted, thereby holding the flip-flops 212 in a reset state. There is no edge triggering, no assertion of the phase tracking signals 215, and no adjustment to the current supplied to the loop filter 220. As such, while the pause signal 211 is asserted, there is an effective de-coupling of the unreliable clock reference from loop parameter adjustments, and the PLL operates in an open-loop manner.

Once the clock reference is determined to be unreliable, asserting such a pause signal 211 can be an effective approach to triggering open-loop operation of the PLL. However, in some cases, it can be difficult to detect precisely when the clock reference becomes unreliable. For example, in the NFC CE mode, the controller module 160 of the CE device 120 can be used to detect the loss of a reliable reference signal and can assert the pause signal 211 as a control signal to the clock module 150. However, particularly while receiving the RF carrier 115 from the reader 110, there may be no way for the controller module 160 to know exactly when the ASK-modulated RF carrier 115 will suddenly disappear. Moreover, when the ASK modulation switches between HIGH and LOW, there is typically a period of time when there continues to be an induced signal in the antenna 130, but the signal effectively has a random phase; the reference is thus unreliable during that timeframe. For these and other reasons, there is typically a delay between the moment at which the clock reference becomes unreliable and the time when the PLL is triggered to operate in an open-loop manner. Even when that delay is relatively short, appreciable phase error can be introduced into the internal clocking signal. A similar effect can also occur when switching back to closed-loop operation. For example, there may be no way for the controller module 160 to know exactly when the ASK-modulated RF carrier 115 will suddenly reappear, and/or when the induced signal in the antenna 130 will settle back to a reliable clock reference. For these and other reasons, there is typically another delay between the moment at which the clock reference becomes reliable and the time when the PLL is triggered to operate in the closed-loop manner. Further, as described herein, when the PLL back is switched back to closed-loop mode, it can initially make incorrect tracking decisions, which can cause further delay until the PLL is accurately locked back onto the again-reliable clock reference.

In the NFC CE operating mode, successful operation can rely on accurate carrier tracking during all communication phases, including during a guard time phase, a frame delay time (FDT) phase, command reception phase, and an ALM phase. Some applications have associated operational constraints (e.g., specified by standards, or the like) for such carrier tracking. For example, a NFC CE mode application may be required to operate with a phase drift of less than a few degrees (e.g., less than five degrees), even when the command reception phase and/or ALM phase times are relatively long (e.g., appreciably longer than ten milliseconds). Such tracking can generally be straightforward during the guard time and frame delay time, where the RF carrier 115 tends to remain reliable. However, as described herein, such tracking becomes more difficult in the command reception phase due to the ASK modulation of the RF carrier 115, and in the ALM phase due to active load modulation of the ALM response signal 125. Further, based on the above, there are at least three timeframes of concern involved with maintaining accurate tracking of a desired carrier in context of an unreliable clock reference, such as during the command reception phase and the ALM phase. The first timeframe begins when the clock reference becomes unreliable and ends when the PLL enters open loop mode and stops tracking, during which time a conventional PLL would continue to track the unreliable clock reference. The second is the timeframe during which the PLL is running open loop, during which the PLL can tend to drift in frequency and/or phase. The third timeframe begins when the PLL is returned to closed mode and begins tracking to the clock reference and ends when the PLL successfully locks back onto the reference phase and frequency.

Some embodiments described herein seek to address concerns involved with the first timeframe. In a typical NFC CE implementation, such embodiments may tend to be most applicable to the command reception phase, when the ASK modulation of the RF carrier 115 causes the reliability of the carrier as a clock reference to be unpredictable. In contrast, during the ALM phase, the CE device 120 (e.g., the controller module 160 and/or the ALM module 165) typically controls when and how the carrier is modulated. As such, the CE device 120 can know exactly when the clock reference for the PLL will and will not be reliable, and can accurately control timing of when the PLL operates in open-loop and closed-loop modes. Such timing can be carefully controlled to substantially eliminate any delay between the clock reference becoming unreliable and the PLL entering open loop mode, thereby substantially eliminating effects of the first timeframe. Still, embodiments described herein can be applied to any suitable phase of any suitable communication environment in which a clock module 150 seeks to maintain tracking with an unpredictably unreliable clock reference.

Figure 3:
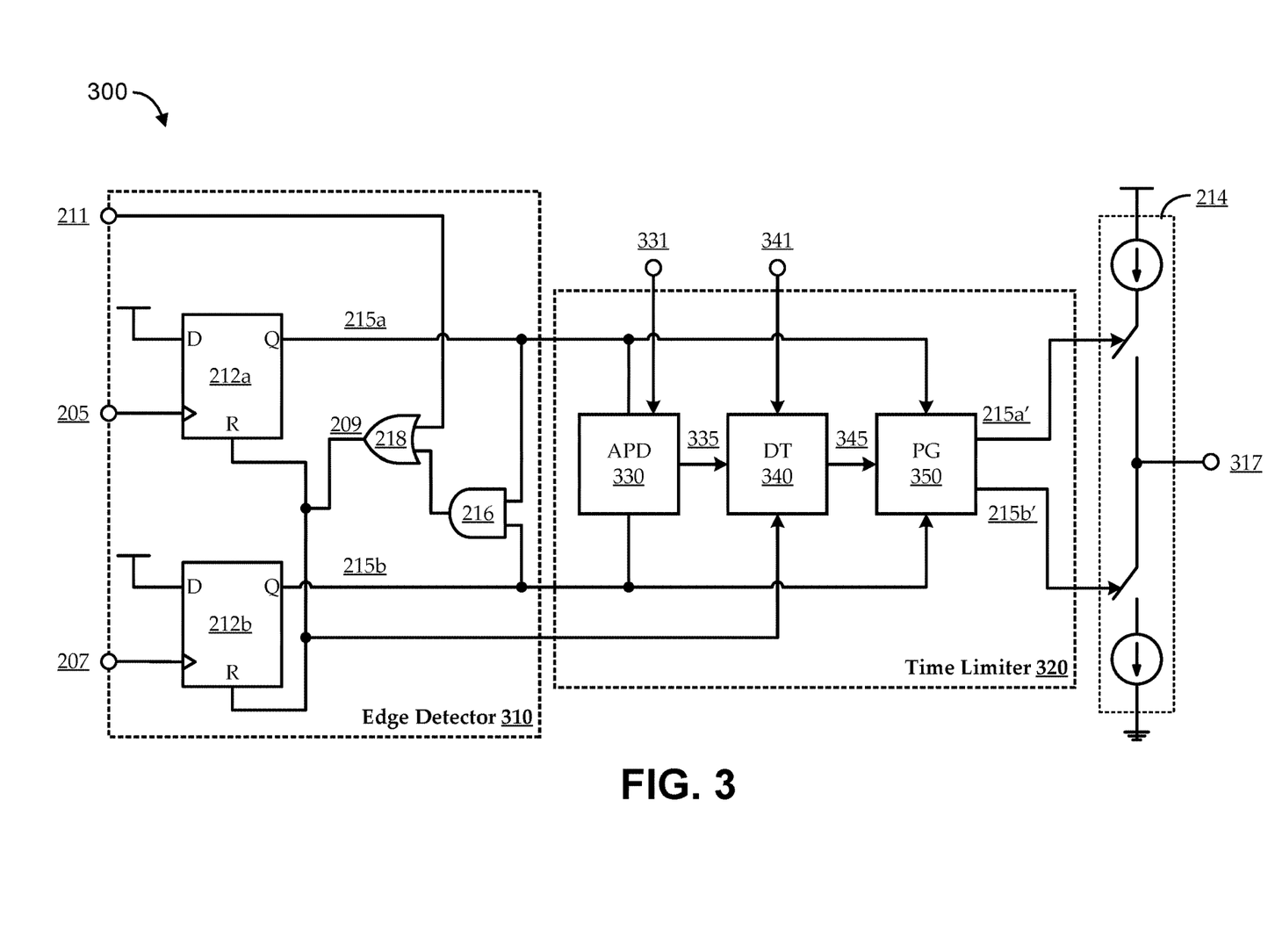
FIG. 3 shows an illustrative novel phase detector, according to various embodiments.

FIG. 3 shows an illustrative novel phase detector 300, according to various embodiments. The phase detector 300 can be an implementation of the phase comparison block 210 of the PLL circuit 200 of FIG. 2, which can be included in an implementation of the clock module 150 of the CE device 120 of FIG. 1. As illustrated, embodiments of the phase detector 300 include an edge detector 310, a time limiter 320, and a charge pump 214. In some embodiments, the edge detector 310 and the charge pump 214 include similar components to, and operate in a similar manner to, similarly labeled components of the phase comparison block 210' of FIG. 2B. As described above, the edge detector 310 can use flip-flops 212, or other suitable components, to detect an edge (e.g., a rising edge) of a PLL_in 205 signal (the clock reference signal) and a PLL_fdbk 207 signal (feedback from the internal clocking signal generated by the PLL). When the PLL_in 205 edge is detected, a first phase tracking signal 215a is asserted; when a PLL_fdbk 207 edge is detected, a second phase tracking signal 215b is asserted; and when both phase tracking signals 215 are asserted, a set of logic gates (AND gate 216 and OR gate 218) assert a reset signal to reset the flip flops 212 until the next loop iteration of the PLL. As illustrated, implementations can also include a pause signal 211, which can effectively stop the phase detector 300 from tracking to the clock reference, thereby setting the PLL to operate in an open-loop mode.

In the conventional implementation shown in FIG. 2B, the phase tracking signals 215 asserted by the flip-flops 212 directly control the charge pump 214. For example, assertion of the first phase tracking signal 215a corresponds to PLL_fdbk 207 lagging PLL_in 205, which directly causes a compensating increase in loop filter current at a charge pump output 317; and the second phase tracking signal 215b corresponds to PLL_fdbk 207 leading PLL_in 205, which directly causes a compensating decrease in loop filter current at a charge pump output 317. However, when the PLL is tracking an unreliable clock reference, this can result in appreciable phase and frequency error (e.g., until the pause signal 211 is ultimately asserted). In the novel phase detector 300 of FIG. 3, embodiments of the time limiter 320 can limit the impact of any phase tracking signal 215, thereby limiting the amount of phase and frequency error that can be introduced into the internal clocking signal in the event of the PLL tracking an unreliable clock reference.

As illustrated, the time limiter 320 can include an absolute phase detection (APD) sub-circuit 330, a delay timer sub-circuit 340, and a pulse gating sub-circuit 350. Embodiments of the APD sub-circuit 330 can detect whether a phase tracking signal 215 (one of the first or the second phase tracking signals 215) is asserted by the edge detector 310 in a present operating cycle of the PLL. As described herein, the phase tracking signal 215 indicates a detected phase difference between PLL_fdbk 207 and PLL_in 205. The APD sub-circuit 330 can output an absolute phase signal 335 responsive to detecting a phase difference between PLL_fdbk 207 and PLL_in 205 based on the phase tracking signal 215, such that the absolute phase signal 335 is asserted regardless of the direction of the phase difference (i.e., regardless of whether PLL_fdbk 207 is leading or lagging PLL_in 205). For example, the absolute phase signal 335 automatically goes HIGH whenever either of the phase tracking signals 215 is HIGH, and the absolute phase signal 335 automatically becomes de-asserted (returns to LOW) when there is a reset of the phase tracking signals 215.

Embodiments of the delay timer sub-circuit 340 are coupled with the APD sub-circuit 330 to determine whether a signal duration of an asserted phase tracking signal 215 exceeds a threshold duration. In some embodiments, the threshold duration is fixed, for example, by being hard-coded into circuitry of the delay timer sub-circuit 340. In other embodiments, the threshold duration is adjustable. The illustrated embodiment shows the delay timer sub-circuit 340 coupled with a control input node to receive a duration adjustment signal 341, and the duration adjustment signal 341 can effectively set the threshold duration. Such setting can be accomplished in any suitable manner. In one implementation, the duration adjustment signal 341 is hardware- or firmware-controlled, such as using switches, transistors, programmable firmware, etc. In another implementation, the duration adjustment signal 341 is dynamically controllable by software, by the controller module 160, etc. For example, a value associated with the duration adjustment signal 341 can be set in a software environment of the CE device 120, which thereby adjusts the threshold duration.

In some implementations, the APD sub-circuit 330 determines whether the signal duration exceeds the threshold duration based on the absolute phase signal 335. For example, when the absolute phase signal 335 is asserted, a delay time begins to record a duration during which the absolute phase signal 335 is asserted. If the delay timer sub-circuit 340 detects that the duration has reached or exceeded a threshold duration, the delay timer sub-circuit 340 can assert a gate trigger signal 345. As illustrated, embodiments of the delay timer sub-circuit 340 are coupled with the reset signal 209, so that the gate trigger signal 345 is effectively reset along with the phase tracking signals 215. Typically, the time-limiting functionality is in effect when the clock reference is unreliable, such as when the RF carrier is absent. At such times, there may be no edge of PLL_in 205 to detect, so that there may be no reset of the phase tracking signals 215 (e.g., until the clock reference becomes present again). In other cases, the RF carrier may not be absent; rather it may be otherwise unreliable (e.g., having indeterminate phase, etc.). In such cases, in each loop iteration of the PLL, the absolute phase signal 335 can be asserted from when a first rising edge is detected (i.e., of the faster of PLL_in 205 or PLL_fdbk 207 in that loop iteration) until a next rising edge is detected (i.e., of the slower of PLL_in 205 or PLL_fdbk 207 in that loop iteration), at which point a reset of the phase tracking signals 215 is triggered by the edge detector 310. Similarly, it can be seen that, in each loop iteration of the PLL, the gate trigger signal 345 may be asserted from when assertion of the absolute phase signal 335 first exceeds the threshold duration until the reset signal 209 is asserted for that loop iteration indicating a reset of the phase tracking signals 215.

Embodiments of the pulse gating sub-circuit 350 are coupled with the delay timer sub-circuit 340 to gate the duration of any phase tracking signal 215 that is asserted beyond the threshold duration controlled by the delay timer sub-circuit 340. In some embodiments, the pulse gating sub-circuit 350 forces de-assertion of any asserted phase tracking signal 215 until a next reset of the flip-flops 212 occurs (e.g., at least for a remainder of the present loop iteration of the PLL) automatically responsive to assertion of the gate trigger signal 345 by the delay timer sub-circuit 340. The output of the pulse gating sub-circuit 350 is a time-limited set of phase tracking signals 215, indicated as phase tracking signals 215'. The time-limited set of phase tracking signals 215' can be used to control the charge pump 214. In effect, each time-limited phase tracking signal 215' can be equal to a corresponding one of the phase tracking signals 215, but only as long as its duration does not exceed the threshold duration. For example, a first time-limited phase tracking signal 215a' is HIGH only when the corresponding first phase tracking signal 215a is HIGH and the gate trigger signal 345 is LOW; when the gate trigger signal 345 is HIGH, the first time-limited phase tracking signal 215a' is LOW, regardless of the state of the corresponding first phase tracking signal 215a.

In some embodiments, the time limiter 320 includes an enable input node to receive a time-delay enable signal 331. In the illustrated implementation, the time-delay enable signal 331 is coupled with the APD sub-circuit 330, which can effectively disable the time limiter 320. With such an implementation, when the time-delay enable signal 331 is de-asserted, the APD sub-circuit 330 is effectively disabled, such that there is no assertion of the absolute phase signal 335. As such, the absolute phase signal 335 cannot exceed the threshold duration, such that there will not be any assertion of the gate trigger signal 345, and the time-limited set of phase tracking signals 215 will always follow their corresponding phase tracking signals 215. Other implementations can use the time-delay enable signal 331 in any other suitable manner to provide for selective enabling and disabling of the time limiter 320. In one such implementation, the time-delay enable signal 331 is coupled with the delay timer sub-circuit 340 to hold the gate trigger signal 345 in a de-asserted state when the time-delay enable signal 331 is de-asserted.

Some implementations use the time-delay enable signal 331 to selectively disable the time limiter 320 during certain phases of operation. As noted above, a result of the time limiter 320 can be to limit the ability of the PLL to dynamically adjust in any one or more operating cycles, thereby minimizing the amount of phase and/or frequency drift that can occur while tracking an unreliable reference. However, in some phases of operation, limiting the PLL's ability to dynamically adjust can cause an undesirable slowing of the PLL functionality. For example, during startup of the PLL, or otherwise when the PLL is seeking to lock onto a clock reference, it can be desirable for such locking to occur as quickly as possible. Disabling the time limiter 320 during those phases can allow the PLL larger per-cycle dynamically adjustments, which can allow the PLL to more quickly lock onto the clock reference.

Figure 4:
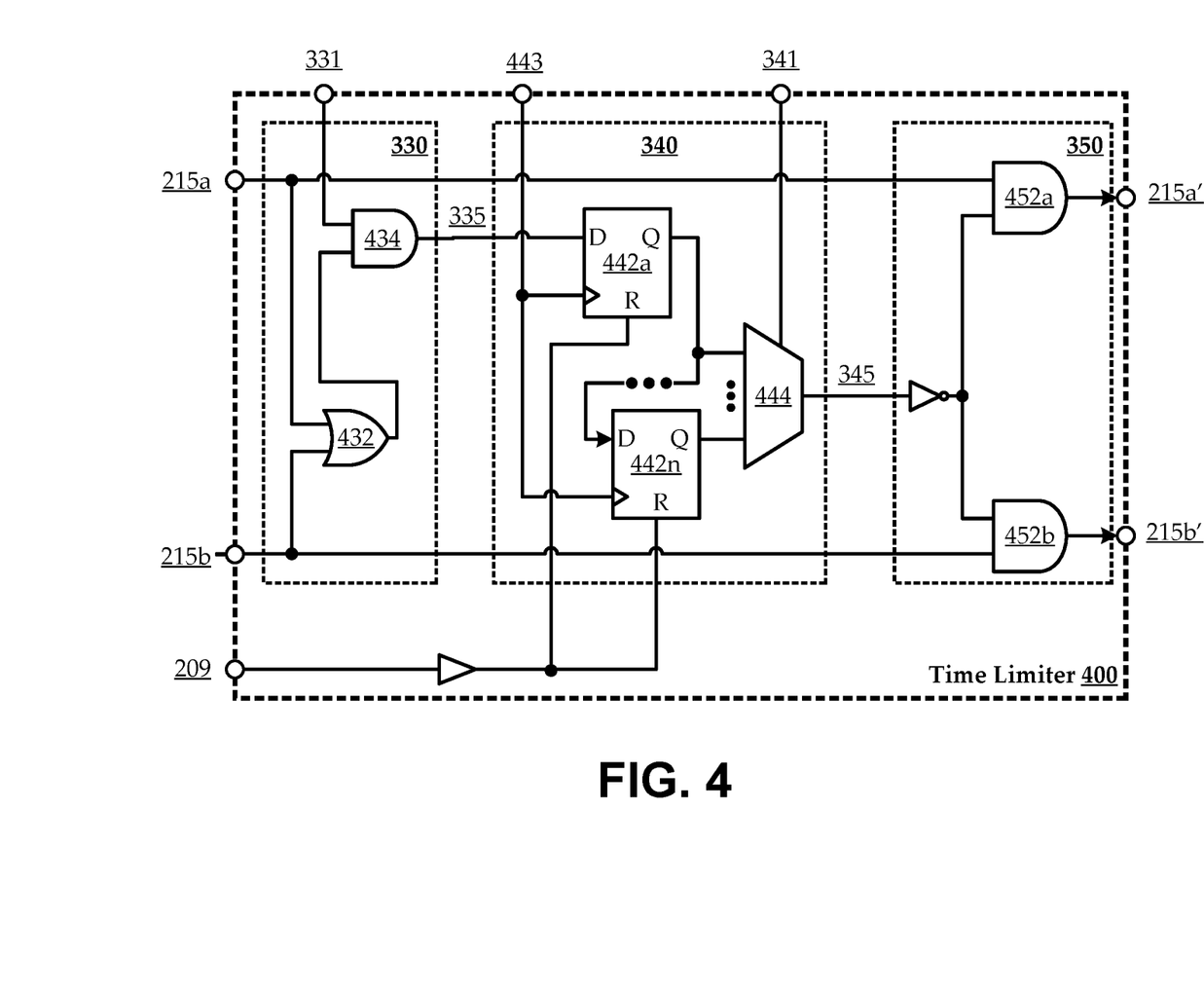
FIG. 4 shows an illustrative circuit implementation of a time limiter for integration in a phase comparison block of a clock module, according to various embodiments.

The time limiter 320 can be implemented using any suitable components in any suitable arrangement. FIG. 4 shows an illustrative circuit implementation of a time limiter 400 for integration in a phase comparison block of a clock module 150, according to various embodiments. For example, the time limiter 400 can be an implementation of the time limiter 320 in the phase detector 300 of FIG. 3. The illustrated time limiter 400 circuitry can be integrated in circuitry of other components, implemented as a dedicated integrated circuit, or implemented in any other suitable manner. As shown, the time limiter 400 can have input and/or output nodes for coupling components of the time limiter 400 with signal paths, such as signal paths of an edge detector 310 and a charge pump 214. As described with reference to FIG. 3, the time limiter 400 can include an APD sub-circuit 330, a delay timer sub-circuit 340, and a pulse gating sub-circuit 350.

The illustrated APD sub-circuit 330 includes an OR gate 432 having inputs coupled with the phase tracking signals 215, such that the OR gate 432 asserts its output when the first and/or second phase tracking signal 215 is asserted. As such, an asserted signal at the output of the OR gate 432 indicates that there is a phase difference between PLL_in 205 and PLL_fdbk 207. In some implementations, the output of the OR gate 432 is used as the absolute phase signal 335. In other implementations, the APD sub-circuit 330 further includes an AND gate 434 having inputs coupled with the output of the OR gate 432 and the time-delay enable signal 331, such that AND gate 434 asserts its output only when both the OR gate 432 output and the time-delay enable signal 331 are asserted. In such implementations, the output of the AND gate 434 is used as the absolute phase signal 335, such that the absolute phase signal 335 indicates that there is a phase difference between PLL_in 205 and PLL_fdbk 207 and time limiting is enabled.

The illustrated delay timer sub-circuit 340 can be coupled with the APD sub-circuit 330 via the absolute phase signal 335. As illustrated, the delay timer sub-circuit 340 can include a number of time delay elements, such as a multiple flip-flops 442 coupled together in a chain. The chain of flip-flops 442 can be clocked by any suitable delay timer clock signal 443 that is appreciably faster than the output frequency of the PLL (e.g., the carrier frequency). In operation, when the absolute phase signal 335 is asserted, it is clocked into the first of the chain of flip-flops 442; and assertion of the absolute phase signal 335 propagates through the chain of flip-flops 442, causing assertion of the output of each subsequent flip flop 442 in the chain with each cycle of the delay timer clock signal 443. The amount of time it takes for propagation through the entire chain of flip-flops 442 is a function of the number of flip-flops 442 in the chain and the frequency of the delay timer clock signal 443, which effectively sets the threshold duration (i.e., the chain of flip-flops 442 effectively implement a delay timer set with the threshold duration). If propagation continues through the entire chain of flip-flops 442 until the output of the last flip flop 442 in the chain is ultimately asserted, that output can be used to assert the gate trigger signal 345 as an indication that the full threshold duration has been reached. As illustrated, the chain of flip-flops 442 are coupled with the reset signal 209 (e.g., via a buffer). As such, if a reset occurs in the present operating cycle of the PLL, the flip-flops 442 reset, which effectively resets the delay timer. For example, in a particular operating cycle of the PLL, when either one of the phase tracking signals 215 is asserted, the absolute phase signal 335 can be asserted, and the asserted absolute phase signal 335 can start propagating through the chain of flip-flops 442. If the other phase tracking signal 215 is asserted before the propagation reaches the last flip-flop 442 in the chain, a reset is triggered, causing assertion of the reset signal 209 and resetting of the delay timer. However, if the other phase tracking signal 215 is not asserted before the propagation reaches the last flip-flop 442 in the chain, the output of the last flip-flop 442 in the chain will cause the gate trigger signal 345 to become asserted. The gate trigger signal 345 can remain asserted until a next reset of the flip-flops 212.

In some implementations, as illustrated, the delay timer sub-circuit 340 includes a selector component, such as a multiplexer 444. Inputs of the multiplexer 444 are coupled with respective outputs of some or all of the flip-flops 442 in the chain, and the output of the multiplexer 444 is a selected one of those inputs, as controlled by the duration adjustment signal 341. In the illustrated implementation, setting the duration adjustment signal 341 effectively controls the length of the chain of flip-flops 442 by selecting which flip-flop 442 output to use for asserting the gate trigger signal 345. Any suitable number of delay components can be included in the chain, depending on the desired range of threshold delays, how finely it is desired to tune the threshold delay, and/or other factors. In some implementations, the multiplexer 444 output is used directly as the gate trigger signal 345.

The illustrated pulse gating sub-circuit 350 is coupled with the delay timer sub-circuit 340 via the gate trigger signal 345. As shown, the pulse gating sub-circuit 350 can include an inverter and a pair of AND gates 452. Each AND gate 452 can generate a respective one of the time-limited set of phase tracking signals 215' at its output, responsive to one input being coupled with the complement of the gate trigger signal 345, and another input being coupled with a respective one of the phase tracking signals 215. In such a configuration, each time-limited phase tracking signal 215' is asserted when the corresponding phase tracking signal 215 is asserted and the gate trigger signal 345 is not asserted. For example, each time-limited phase tracking signal 215' is equal to its corresponding phase tracking signal 215, but only as long as its duration does not exceed the threshold duration. When the threshold duration is exceeded, the gate trigger signal 345 forces de-assertion of any asserted time-limited phase tracking signal 215', regardless of whether its corresponding phase tracking signal 215 is asserted.

Figure 5:
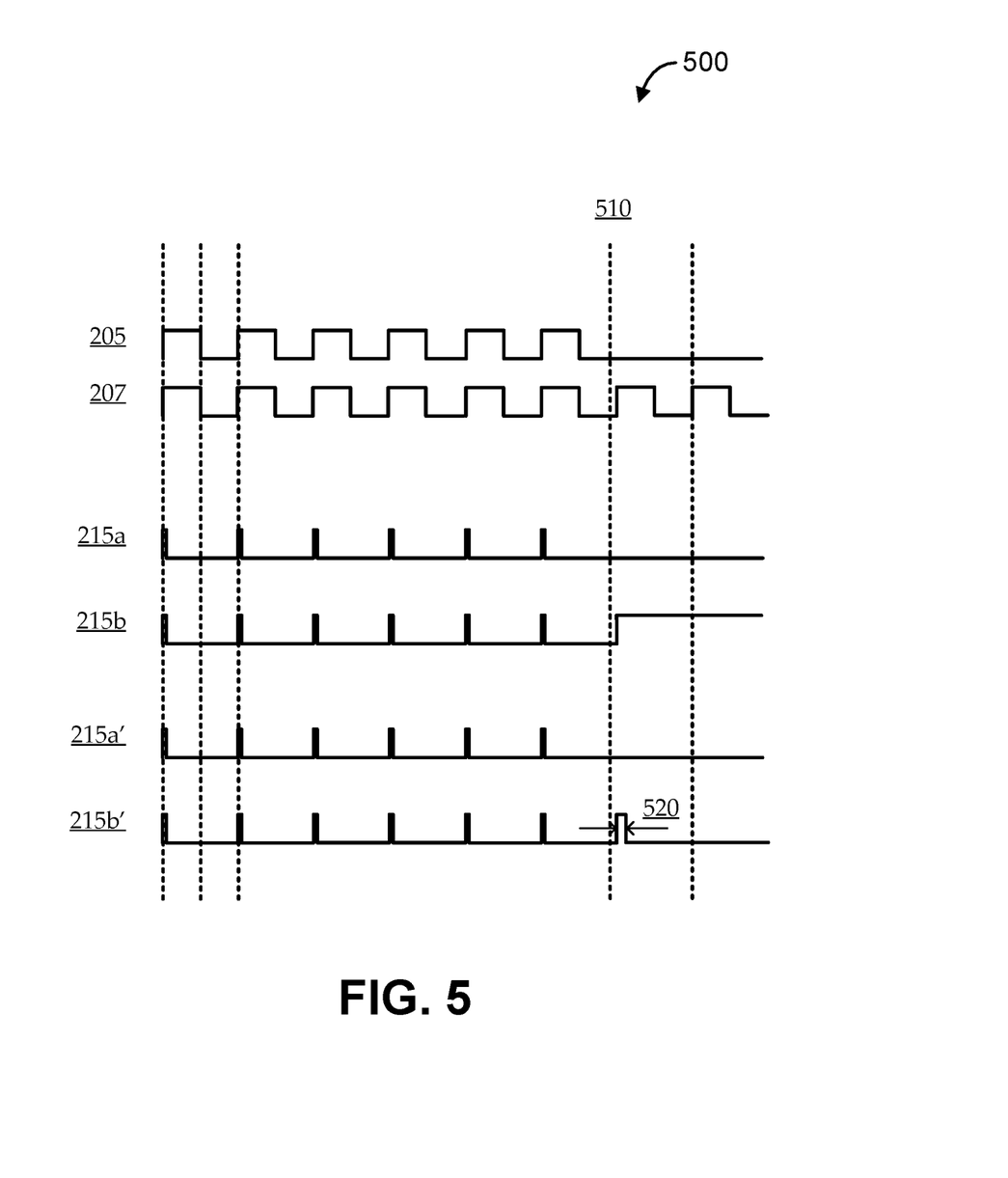
FIGS. 5 and 6, which show illustrative plots of various signals of a phase detector having a novel time limiter, as described herein.
Figure 6:
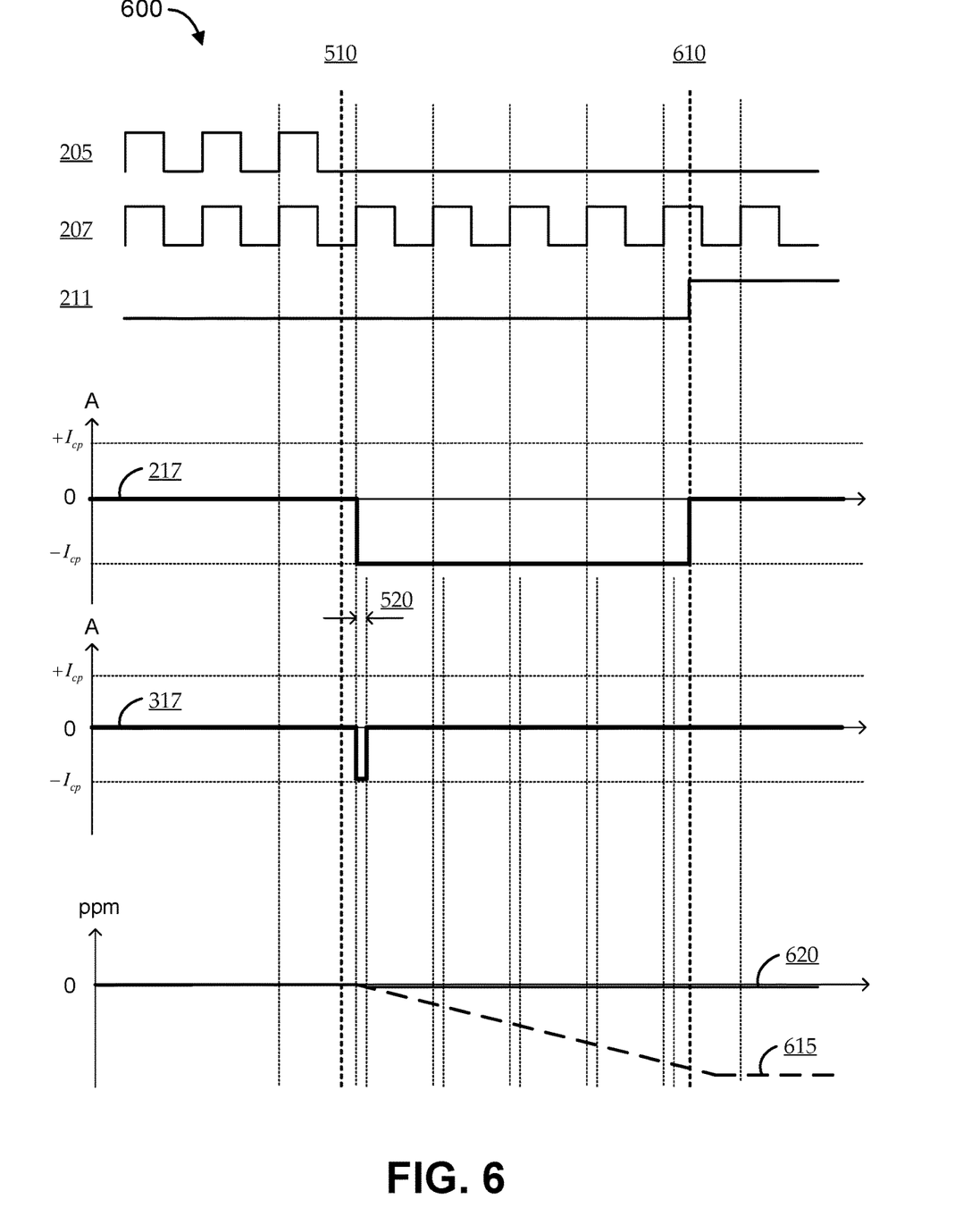

Such time-limiting of the phase tracking signals 215 can be seen in FIGS. 5 and 6, which show illustrative plots 500 and 600 of various signals of a phase detector having a novel time limiter, as described herein. Turning first to FIG. 5, the plots 500 begin in a timeframe when steady state has been reached, such that the clock reference is reliable, and the PLL has locked onto and is accurately tracking the clock reference. For example, the clock reference at PLL_in 205 is faithfully represented by PLL_fdbk 207, corresponding to feedback of the PLLout 240 signal. In such a steady state condition, at each rising edge of PLLin 205 and PLL_fdbk 207, the edge detector 310 may briefly assert the first phase tracking signal 215a and the second phase tracking signal 215b prior to triggering a reset. At the output of the time limiter 320, the time-limited phase tracking signals 215' may be substantially equivalent to their corresponding phase tracking signals 215, as the durations are well within the threshold duration.

At some time 510, the clock reference becomes unreliable (e.g., illustrated as immediately disappearing). It can be seen that, after this occurs, the next rising edge is necessarily from the PLL_fdbk 207 signal, which triggers assertion of the second phase tracking signal 215b. This is effectively a "down" signal, indicating to the PLL that its output is too fast, and compensation is need to slow the PLL output. Because the PLLin 205 has disappeared, no edge is detected for PLLin 205 in the operating cycle, and no signal is available to trigger a reset. As such, the second phase tracking signal 215b remains asserted. Without the time limiter 320, the second phase tracking signal 215b may remain asserted until the pause signal 211 is detected. Meanwhile, the PLL will continue to attempt tracking of the unavailable clock reference, repeatedly making an improper compensation determination.

However, this effect can be mitigated by the time limiter 320. As shown, embodiments of the time limiter 320 may still assert the second time-limited phase tracking signal 215b' (corresponding to the second phase tracking signal 215b) in response to detecting the rising edge of PLL_fdbk 207 subsequent to time 510. However, as soon as the duration of the asserted second time-limited phase tracking signal 215b' reaches the threshold duration (illustrated as reference 520), the time limiter 320 forces de-assertion and resetting of the delay timer. As noted above, with no rising edge of PLL_in 205 after time 510 to trigger a reset of the phase tracking signals 215, the second phase tracking signal 215b remains asserted. However, because of the time-limiting, the second time-limited phase tracking signal 215b' only remains asserted for the threshold duration 520, thereby limiting the impact of the incorrect compensation decision. Even if some unreliable artifact in PLL_in 205 causes a reset of the phase tracking signals 215, the time-limiting still limits assertion of the phase tracking signals 215' to a small portion of each operating cycle of the PLL, thereby limiting the impact of the incorrect compensation decision in each operating cycle.

Turning to FIG. 6, the plots 600 illustrate an extension of the timeframe illustrated in FIG. 5. Again, the PLLin 205 plot shows the clock reference becoming absent at some time 510. After additional time elapses, the absence of the clock reference is ultimately detected, and the pause signal 211 is asserted at time 610. Without the time limiter 320, the resulting charge pump current output (e.g., the charge pump current 217 shown in the illustrative conventional implementation of FIG. 2B) may be controlled directly by the phase tracking signal 215. As such, upon detection of the next rising edge after time 510 (from the PLL_fdbk 207 signal), the second phase tracking signal 215b is asserted (as shown in FIG. 5), causing the charge pump current 217 to drop to a negative level (−I_cp). Without time limiting, the charge pump current 217 continues to be held at the negative level until the pause signal is asserted 211, thereby forcing a reset.

With the time limiter 320, the charge pump current is controlled instead by the time-limited phase tracking signals 215', as with charge pump current 317 of FIG. 3. As shown, embodiments of the time limiter 320 may still assert the second time-limited phase tracking signal 215b' (corresponding to the second phase tracking signal 215b) in response to detecting the rising edge of PLL_fdbk 207 subsequent to time 510, triggering a corresponding switching of the charge pump current 317 to the negative level (−I_cp). However, as soon as the duration of the asserted second time-limited phase tracking signal 215b' reaches the threshold duration (illustrated as reference 520), the time limiter 320 forces de-assertion and resetting of the delay timer, returning the charge pump current 317 to zero.

The bottom-most graph of FIG. 6 shows two plots of relative phase error between PLL_fdbk 207 and PLLin 205. The first relative phase error plot 615 corresponds to the plot of charge pump current 217 without a time limiter 320. It can be seen that, in the timeframe between time 510 and time 610, the magnitude of phase error rapidly and continuously increases (i.e., moves away from zero). The second relative phase error plot 620 corresponds to the plot of charge pump current 317 with a time limiter 320. It can be seen that, in the timeframe between time 510 and time 610, the magnitude of phase error still increases, but only slightly. In particular, the magnitude of phase error primarily changes only during the small window when the time-limited phase tracking signal 215' is asserted, corresponding to the threshold duration. In some implementations, setting the threshold duration to limit the pulse width to around ten degrees can reduce the frequency error by around 36 times as compared to implementations that do not include a time limiter 320. As such, integrating the time limiter 320 in a PLL can facilitate a number of features, such as supporting a wider PLL loop bandwidth, shorter PLL start-up time, reduced loop filter area, etc.

Figure 7:
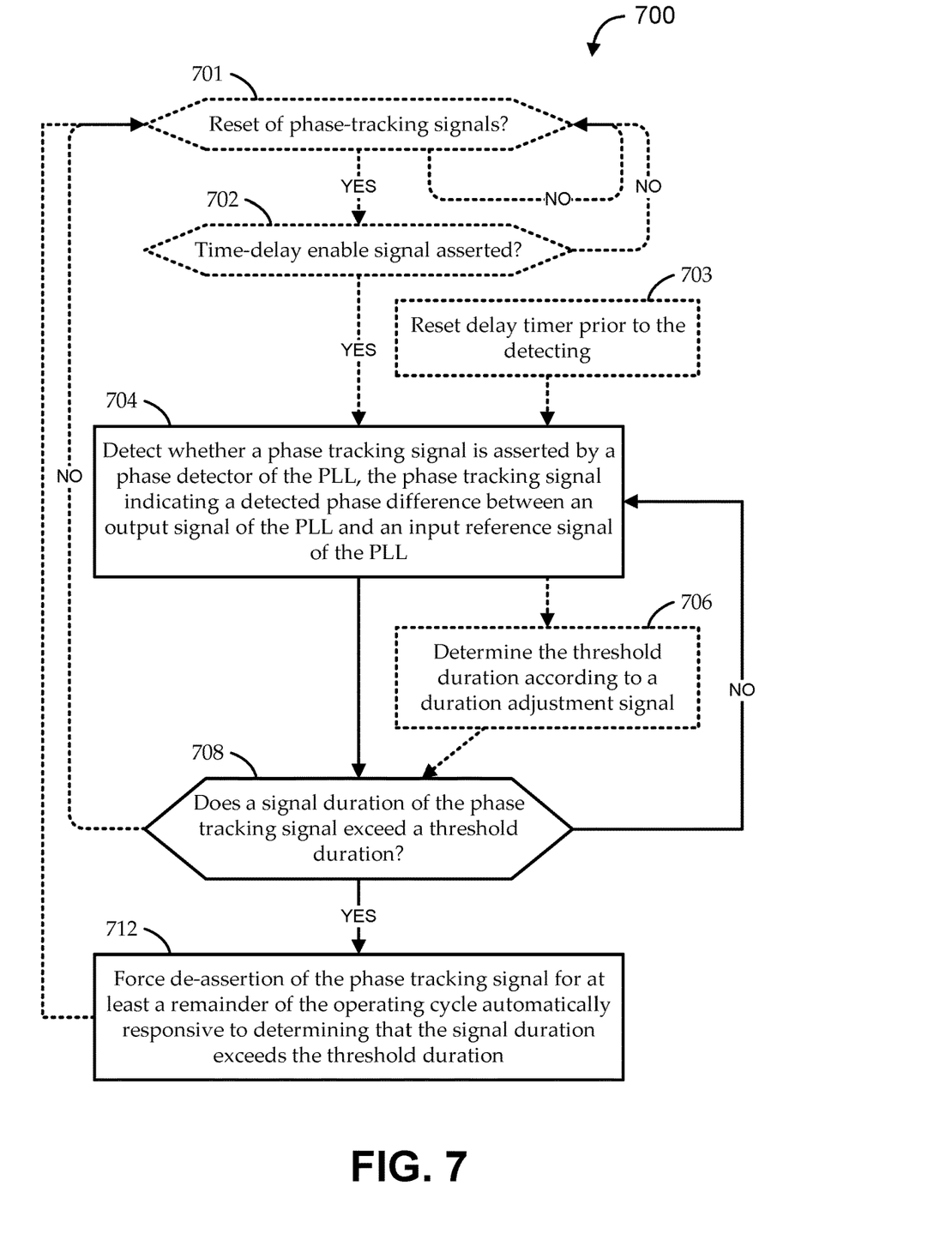
FIG. 7 shows a flow diagram of an illustrative method for time-limited carrier phase tracking in a phase detector of a clock circuit, according to various embodiments.

FIG. 7 shows a flow diagram of an illustrative method 700 for time-limited carrier phase tracking in a phase detector of a clock circuit, according to various embodiments. In some embodiments, some or all steps of the method 700 are performed iteratively for each operating cycle of the clock circuit (e.g., a PLL). In other embodiments, some or all steps of the method 700 are performed only after resetting of the phase tracking signals. For example, some such embodiments 700 can begin at stage 701 by determining whether the phase tracking signals have been reset (e.g., by assertion of a reset signal that resets edge triggering flip-flops of the phase detector). In such embodiments, some or all other steps of the method 700 are performed only after such a reset occurs, and the method 700 continues to wait for such a reset otherwise. In other embodiments, some or all steps of the method 700 are performed iteratively for each operating cycle of the clock circuit only where the method is enabled. For example, some such embodiments 700 can begin at stage 702 by determining whether a time-delay enable signal (e.g., time-delay enable signal 331) is asserted, and performing some or all other steps of the method 700 only when the time-delay enable signal is asserted.

Some embodiments of the method 700 begin at stage 704 by detecting whether a phase tracking signal (e.g., the first and/or second phase tracking signal 215) is asserted (e.g., for the operating cycle) by a phase detector. The phase tracking signal indicates a detected phase difference between an output signal of the PLL (e.g., PLL_fdbk 207) and an input reference signal of the PLL (e.g., PLLin 205). At stage 708, embodiments can determine, automatically responsive to detecting that the phase tracking signal is asserted, whether a signal duration of the phase tracking signal exceeds a threshold duration. If not, embodiments can return to an appropriate stage of the method 700 (e.g., waiting for a reset in anticipation of the next operating cycle by returning to stage 701, continuing to detect whether the signal duration has exceeded the threshold duration at stage 704, etc.).

If the signal duration of the phase tracking signal is detected to exceed the threshold duration in stage 708, embodiments can force de-assertion of the phase tracking signal at stage 712 (e.g., for a remainder of the operating cycle and/or until a reset occurs). For example, the detection in stage 708 of the signal duration of the phase tracking signal exceeding the threshold duration can cause assertion of a gate trigger signal 345, which can be used to gate the phase tracking signals 215. In accordance with such gating, the method 700 can ensure that the phase tracking signal 215 do not remain asserted beyond the threshold duration. In some embodiments, at stage 706, the method 700 can include determining the threshold duration according to a duration adjustment signal. In such embodiments, the threshold duration is adjustable by the duration adjustment signal. In some embodiments, prior to the detecting in stage 704, the method 700 can reset a delay timer. In such embodiments, the delay time can be set with the threshold duration and can facilitate the determination in stage 708.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A time limiter circuit for integration with a phase detector of a phase-locked loop (PLL), the time limiter circuit comprising:
an absolute phase detection sub-circuit to detect whether a phase tracking signal is asserted by the phase detector, the phase tracking signal indicating a detected phase difference between an output signal of the PLL and an input reference signal of the PLL;
a delay timer sub-circuit, coupled with the absolute phase detection sub-circuit to determine, automatically responsive to the absolute phase detection sub-circuit detecting that the phase tracking signal is asserted, whether a signal duration of the phase tracking signal exceeds a threshold duration; and
a pulse gating sub-circuit, coupled with the delay timer sub-circuit to force de-assertion of the phase tracking signal for at least a remainder of a present operating cycle of the PLL automatically responsive to the delay timer sub-circuit determining that the signal duration exceeds the threshold duration.

2. The time limiter circuit of claim 1, further comprising:
an enable input node to receive a time-delay enable signal, wherein the pulse gating sub-circuit is to force the de-assertion only when the time-delay enable signal is asserted.

3. The time limiter circuit of claim 1, wherein:
the absolute phase detection sub-circuit is to generate an absolute phase signal responsive to detecting that the phase tracking signal is asserted by the phase detector;
the delay timer sub-circuit is to generate a gate trigger signal automatically responsive to determining that the signal duration exceeds the threshold duration based on the absolute phase signal; and
the pulse gating sub-circuit is to generate a time-limited tracking signal, such that a duration of the time-limited tracking signal is limited by the pulse gating sub-circuit forcing the de-assertion responsive to the gate trigger when the signal duration exceeds the threshold duration, and is limited by the duration of the phase tracking signal otherwise.

4. The time limiter circuit of claim 3, wherein:
the phase tracking signal is one of an up signal or a down signal, such that assertion of the up signal increases current injection into a loop filter of the PLL, and assertion of the down signal decreases current injection into the loop filter; and
the absolute phase detection sub-circuit is to generate the absolute phase signal such that the absolute phase signal is asserted responsive to up signal being asserted and/or the down signal being asserted.

5. The time limiter circuit of claim 1, wherein the delay timer sub-circuit comprises:
a control input node to receive a duration adjustment signal; and
a plurality of delay elements controllable according to the duration adjustment signal to adjust the threshold duration.

6. The time limiter circuit of claim 1, wherein the delay timer sub-circuit comprises:
a reset node to receive a reset signal; and
one or more delay elements to set the threshold duration, wherein the one or more delay elements are reset according to the reset signal prior to determining whether the signal duration exceeds the set threshold duration.

7. A phase-locked loop (PLL) circuit comprising:
a PLL input node to receive a reference clock signal;
a PLL output node to output a generated clock signal; and
a phase detector, coupled with the PLL input node and the PLL output node to generate a phase tracking signal indicating a phase difference between the reference clock signal and the generated clock signal, the phase tracking signal comprising a first phase tracking signal responsive to a phase of the reference clock signal preceding a phase of the generated clock signal, and a second phase tracking signal responsive to the phase of the generated clock signal preceding the phase of the reference clock signal, the phase detector having a time limiter circuit comprising:
an absolute phase detection sub-circuit to detect whether the phase tracking signal is asserted by the phase detector;
a delay timer sub-circuit, coupled with the absolute phase detection sub-circuit to determine, automatically responsive to the absolute phase detection sub-circuit detecting that the phase tracking signal is asserted, whether a signal duration of the phase tracking signal exceeds a threshold duration; and
a pulse gating sub-circuit, coupled with the delay timer sub-circuit to force de-assertion of the phase tracking signal for at least a remainder of a present operating cycle of the PLL automatically responsive to the delay timer sub-circuit determining that the signal duration exceeds the threshold duration.

8. The PLL circuit of claim 7, wherein the time-limiter circuit further comprises:
an enable input node to receive a time-delay enable signal, wherein the pulse gating sub-circuit is to force the de-assertion only when the time-delay enable signal is asserted.

9. The PLL circuit of claim 7, wherein:
the absolute phase detection sub-circuit is to generate an absolute phase signal responsive to detecting that the phase tracking signal is asserted by the phase detector;
the delay timer sub-circuit is to generate a gate trigger signal automatically responsive to determining that the signal duration exceeds the threshold duration based on the absolute phase signal; and
the pulse gating sub-circuit is to generate a time-limited tracking signal, such that a duration of the time-limited tracking signal is limited by the pulse gating sub-circuit forcing the de-assertion responsive to the gate trigger when the signal duration exceeds the threshold duration, and is limited by the duration of the phase tracking signal otherwise.

10. The PLL circuit of claim 9, further comprising:
a loop filter, coupled with the phase detector, such that assertion of the first phase tracking signal increases current injection into a loop filter of the PLL, and assertion of the second phase tracking signal decreases current injection into the loop filter.

11. The PLL circuit of claim 7, wherein the delay timer sub-circuit comprises:
a control input node to receive a duration adjustment signal; and
a plurality of delay elements controllable according to the duration adjustment signal to adjust the threshold duration.

12. The PLL circuit of claim 7, wherein the delay timer sub-circuit comprises:
a reset node to receive a reset signal; and
one or more delay elements to set the threshold duration, wherein the one or more delay elements are reset according to the reset signal prior to determining whether the signal duration exceeds the set threshold duration.

13. The PLL circuit of claim 7, wherein:
the reference clock signal is an amplitude shift key (ASK) modulated radiofrequency carrier signal.

14. A portable electronic device having the PLL circuit of claim 7 integrated therein, wherein:
the portable electronic device is associated with stored data and comprises an active load modulation circuit configured to generate a response signal based on active load modulation of the generated clock signal in accordance with a near field communication (NFC) card emulation (CE) mode of operation.

15. A method comprising:
detecting whether a phase tracking signal is asserted by a phase detector of the phase-locked loop (PLL), the phase tracking signal indicating a detected phase difference between an output signal of the PLL and an input reference signal of the PLL;
determining, automatically responsive to detecting that the phase tracking signal is asserted, whether a signal duration of the phase tracking signal exceeds a threshold duration; and
forcing de-assertion of the phase tracking signal for at least a remainder of a present operating cycle of the PLL automatically responsive to determining that the signal duration exceeds the threshold duration.

16. The method of claim 15, further comprising, for each of the plurality of operating cycles:
determining whether a time-delay enable signal is asserted,
wherein the forcing de-assertion is performed only when the time-delay enable signal is asserted.

17. The method of claim 15, wherein:
the phase tracking signal is one of an up signal or a down signal;
assertion of the up signal increases current injection into a loop filter of the PLL; and
assertion of the down signal decreases current injection into the loop filter.

18. The method of claim 15, further comprising, for each of the plurality of operating cycles:
determining the threshold duration according to a duration adjustment signal,
wherein the threshold duration is adjustable by the duration adjustment signal.

19. The method of claim 15, further comprising, for each of the plurality of operating cycles:
resetting a delay timer prior to the detecting, the delay timer performing the determining.

20. The method of claim 15, wherein:
the input reference signal of the PLL is an amplitude shift key (ASK) modulated radiofrequency carrier signal.

* * * * *